US006496375B2

(12) United States Patent
Patel et al.

(10) Patent No.: US 6,496,375 B2
(45) Date of Patent: Dec. 17, 2002

(54) COOLING ARRANGEMENT FOR HIGH DENSITY PACKAGING OF ELECTRONIC COMPONENTS

(75) Inventors: Chandrakant D. Patel, Fremont, CA (US); Vernon Alan Barber, Sandpoint, ID (US); Hannsjörg Obermaier, Los Gatos, CA (US); Christian Belady, McKinney, TX (US); David Mike Chastain, Frisco, TX (US)

(73) Assignee: Hewlett-Packard Company, Palo Alto, CA (US)

( * ) Notice: Subject to any disclaimer, the term of this patent is extended or adjusted under 35 U.S.C. 154(b) by 11 days.

(21) Appl. No.: 09/845,546

(22) Filed: Apr. 30, 2001

(65) Prior Publication Data

US 2002/0159237 A1 Oct. 31, 2002

(51) Int. Cl.[7] .................................................. H05K 7/20
(52) U.S. Cl. ....................... 361/719; 361/699; 361/707; 174/15.1; 165/104.33
(58) Field of Search ................................. 361/683, 679, 361/689, 690, 704, 707, 709, 711, 714–717, 719–731, 735, 760, 767, 773, 796, 807, 809, 810; 174/16.3, 260, 52.1, 52.4; 211/41; 248/27.1, 310; 269/903; 206/328, 329, 701, 707, 710, 711, 718; 165/80.3, 185, 104.32, 104.33; 257/700–727, 730

(56) References Cited

U.S. PATENT DOCUMENTS

| 4,884,331 A | * | 12/1989 | Hinshaw ..................... 29/558 |
|---|---|---|---|
| 5,014,117 A | | 5/1991 | Horvath et al. |
| 5,057,968 A | * | 10/1991 | Morrison ..................... 361/395 |
| 5,060,112 A | * | 10/1991 | Cocconi ..................... 361/386 |
| 5,159,529 A | | 10/1992 | Lovgren et al. |
| 5,370,178 A | | 12/1994 | Agonafer et al. |
| 5,684,675 A | * | 11/1997 | Taniguchi et al. .......... 361/704 |
| 5,815,371 A | * | 9/1998 | Jefferies et al. ............. 361/704 |
| 5,986,888 A | * | 11/1999 | Amaro et al. ................ 361/704 |
| 6,055,157 A | | 4/2000 | Bartilson |
| 6,068,051 A | * | 5/2000 | Wendt ......................... 165/185 |
| 6,111,749 A | | 8/2000 | Lamb et al. |
| 6,173,759 B1 | | 1/2001 | Galyon et al. |
| 6,185,101 B1 | * | 2/2001 | Itabashi et al. ............. 361/704 |
| 6,252,775 B1 | * | 6/2001 | Kuroda ....................... 361/707 |
| 6,330,160 B1 | * | 12/2001 | Ayres et al. ................. 361/707 |
| 6,421,240 B1 | * | 7/2002 | Patel .......................... 361/699 |

* cited by examiner

Primary Examiner—Darren Schuberg
Assistant Examiner—Michael Datskovsky (57) ABSTRACT

A cooling arrangement facilitates the cooling of a plurality of integrated circuit elements disposed on a plurality of substrates that are substantially perpendicularly mounted on a main substrate. In an example embodiment, the cooling arrangement provides cooling for a plurality of integrated circuit elements disposed on a plurality of substrates that are substantially perpendicularly mounted on a main substrate. The cooling arrangement includes a plurality of U-shaped thermally conductive members, each having a set of leg portions connected with a top portion and an open end disposed over a respective one of the substrates. In addition, a first inner surface of at least one of the leg portions is in thermal contact with at least one of the integrated circuit elements. The cooling arrangement further includes a housing member containing therein the U-shaped members and includes a cooling plate arrangement in thermal contact with the housing and the top portions of the U-shaped members.

32 Claims, 6 Drawing Sheets

COOLING ARRANGEMENT FOR HIGH DENSITY PACKAGING OF ELECTRONIC COMPONENTS

FIELD OF THE INVENTION

The present invention generally relates to cooling systems, and more particularly to cooling packages for electronic components.

BACKGROUND OF THE INVENTION

As computers and computing systems increase in processing power and memory size there is a competing goal to provide these capabilities in ever decreasing packaging sizes. However, as the density of the memory and processing components within computing systems increases, heat dissipation becomes an increasingly important design factor. Major sources of heat in such computing subsystems include microprocessors and hard disk drive assemblies. As new workstations and servers are developed they will incorporate multiple hard disk drive assemblies in close proximity to each other, thus posing a significant thermal cooling challenge.

In the past, computer systems of this kind have incorporated within their enclosures cooling devices such as heat sinks, extended surface devices applied directly to disk drive assemblies, and air movers in the form of fans to increase air mass flow rates. Air volume flow rates on the order of 2.5 to 5 liters/second, at a velocity of 2 to 3 meters/second, typically have been required for each microprocessor. Large multiprocessor systems and large multi-disk drive systems used in dedicated computer rooms can be cooled by moving air at high mass flow rates with the resulting acoustic noise generally having to be tolerated. On the other hand, multiple processor and multiple disk systems used in office environments must meet more stringent acoustic emission guidelines, regulations and customer/user requirements. Thus, cooling the systems by increasing the air mass flow rates is not a practical option.

Efforts have been made in the past to cool electronic systems using a working fluid that undergoes a reversible phase change. In particular, power-dissipating components such as power transistors have been mounted directly to an external panel of such systems. A sealed fluid channel that carries the working fluid is formed in the panel. The working fluid absorbs heat and evaporates in the portion of the fluid channel adjacent to the power transistors. Heat is transferred to other portions of the fluid channel where the gaseous phase cools and the liquid condenses. One of the disadvantages to this approach is the inability to efficiently cool power dissipating components that are not mounted directly on the external panel.

It will be appreciated that there is a need for a system and an arrangement for effectively cooling the heat dissipating components of a computer system without increasing the computer's enclosure size and cost. A system and an arrangement that address the aforementioned problems, as well as other related problems, are therefore desirable.

SUMMARY OF THE INVENTION

The present invention is directed to addressing the above and other needs in connection with cooling microprocessor and memory components and facilitating the increase of the packing density of integrated components. With the present approach, microprocessor and memory modules incorporated into servers and workstations applications that dissipate about 150 to 200 watts each can now be placed in closer proximity to each other thereby increasing processing speed. In addition, multi-processor systems incorporating 32 microprocessors, dissipating about 10 to 12 kilowatts, can now be assembled into single packages that lower costs and increase reliability of high performance systems.

According to one aspect of the invention, an apparatus facilitates the cooling a plurality of integrated circuit elements disposed on a plurality of substrates that are substantially perpendicularly mounted on a main (or mounting) substrate. The apparatus includes a thermally conductive member having a set of leg portions connected with a top portion and an open end configured to be disposed over a respective one of the substrates. A first surface of at least one of the leg portions is configured to be in thermal contact with at least one of the integrated circuit elements and the top portion of the conductive member configured to conduct heat from the leg portions of the conductive member.

According to another aspect of the invention, a cooling arrangement facilitates the cooling of a plurality of integrated circuit elements disposed on a plurality of substrates that are substantially perpendicularly mounted on a mounting substrate. The cooling arrangement includes a plurality of U-shaped thermally conductive members, each having a set of leg portions connected with a top portion and an open end disposed over a respective one of the substrates. In addition, a first surface of at least one of the leg portions is in thermal contact with at least one of the integrated circuit elements. The cooling arrangement further includes a housing member containing therein the U-shaped members. A cooling plate arrangement is also included that is in thermal contact with the housing and the top portions of the U-shaped members.

According to another aspect of the invention, an electronic system in combination with a cooling arrangement provides a circuit module or module that is easily removable from a main circuit board and that cools the integrated circuit elements of the electronic system. The electronic system includes a plurality of substrates substantially perpendicularly mounted in a side by side relationship on a main substrate, wherein each of the substrates includes a plurality of integrated circuit elements. The system further includes a plurality of U-shaped thermally conductive members, each having a set of leg portions connected with a top portion and an open end disposed over a respective one of the substrates. In addition, a first surface of at least one of the leg portions is in thermal contact with at least one of the integrated circuit elements. The system also includes a housing member containing therein the U-shaped members and includes a cooling plate arrangement in thermal contact with the housing and the top portions of the U-shaped members.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Various embodiments of the present invention are described in connection with cooling arrangements that facilitate high-density packaging of electronic components on system boards. In addition, an electronic subsystem in combination with a cooling arrangement facilitates the formation of memory and microprocessor circuit modules that simplify the addition or removal of electronic subsystems from a primary circuit board. Those skilled in the art will appreciate that the invention could be implemented with a variety of integrated circuit elements, mounting schemes and system board layouts.

In an example embodiment, an apparatus facilitates the cooling a plurality of integrated circuit elements disposed on a plurality of substrates that are substantially perpendicularly mounted on a main substrate. The apparatus includes a thermally conductive member having a set of leg portions connected with a top portion and an open end configured to be disposed over a respective one of the substrates. A first surface of at least one of the leg portions is configured to be in thermal contact with at least one of the integrated circuit elements, with the top portion of the conductive member configured to conduct heat from the leg portions of the conductive member.

Figure 1:
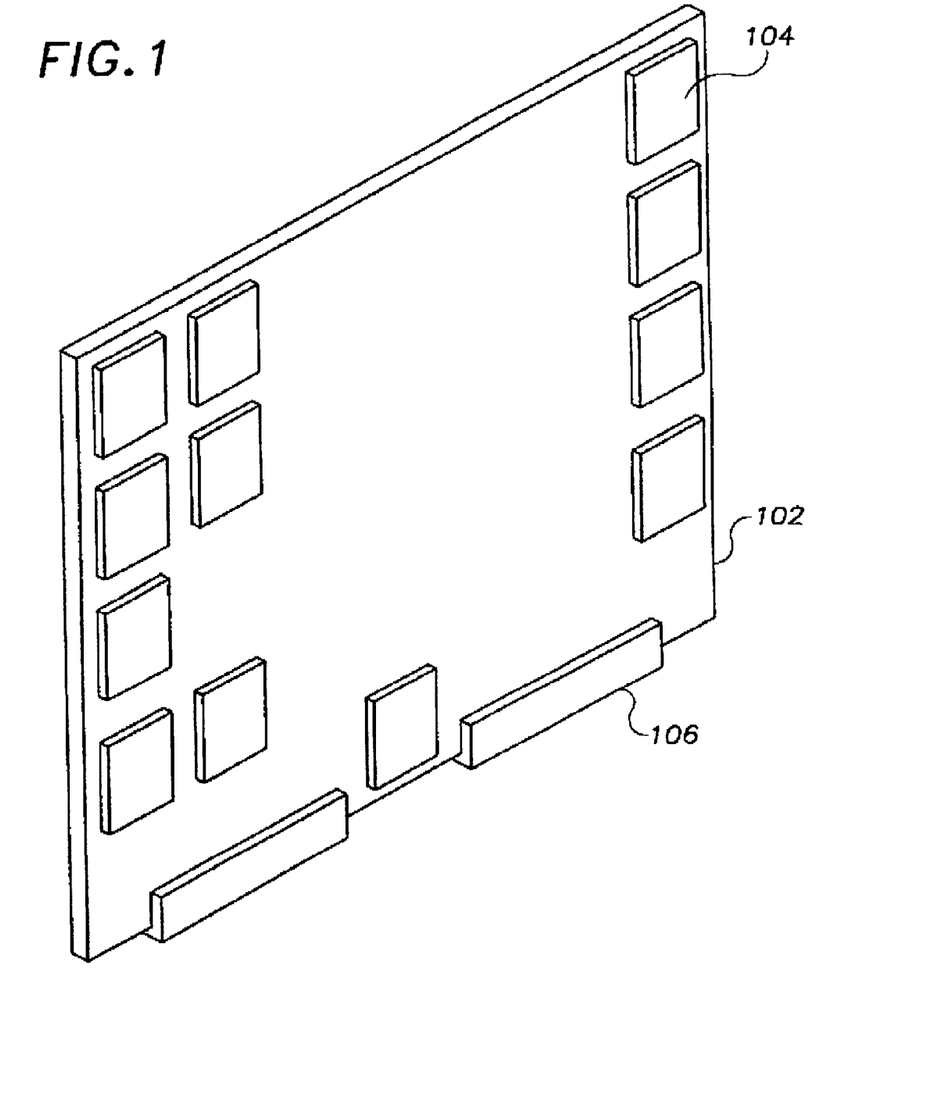
FIG. 1 illustrates an example circuit board that is part of a circuit module made in accordance with an example embodiment of the invention.

Referring now to the figures, FIG. 1 illustrates an example circuit board 102 that is part of a circuit module made in accordance with an example embodiment of the invention. In particular, board 102 is either a printed circuit board or a wiring board that is populated with a plurality of integrated circuit elements 104 either on one or both sides of the board. Board 102 is mounted substantially perpendicularly on a mounting or main substrate (not shown) via a mounting card edge connector 106 in a side by side relationship with other circuit boards. Various circuit boards can be strapped together to form a single circuit module.

Figure 2A:
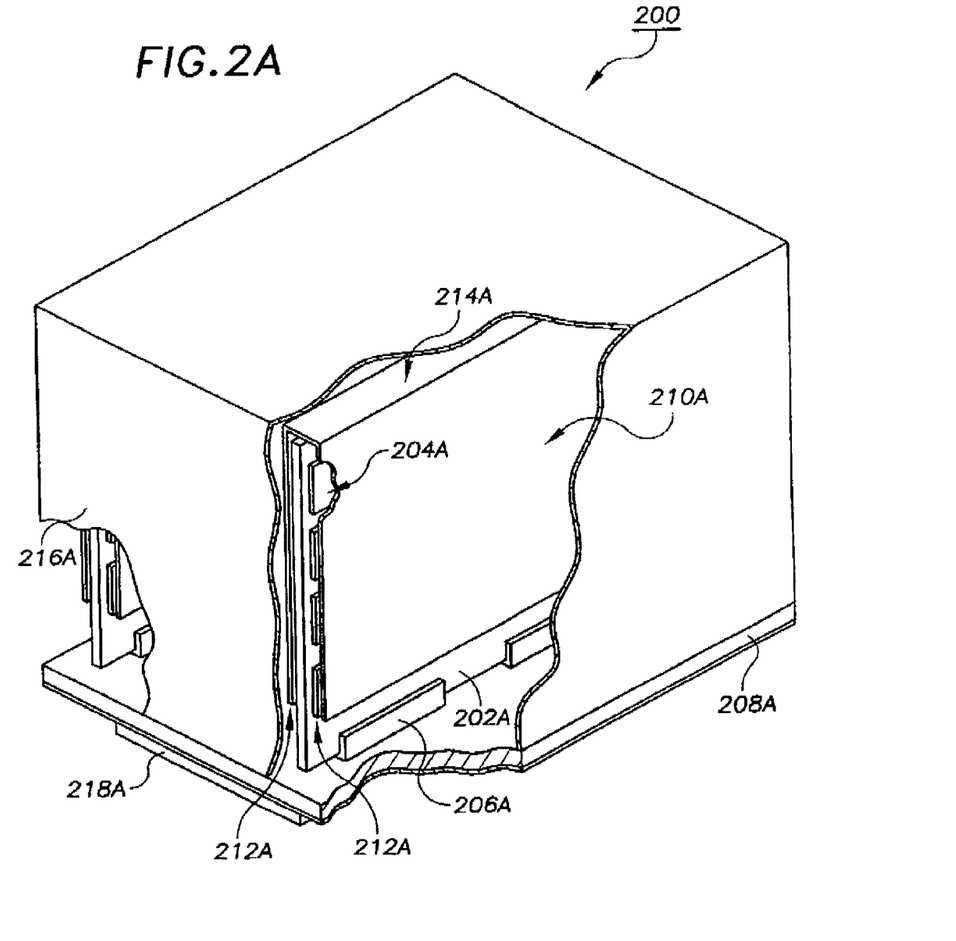
FIG. 2A illustrates an example of a plurality of circuit boards each having a thermally conductive member disposed thereon in accordance with an example embodiment of the invention.

Referring now to FIG. 2A, a circuit module 200 is shown that includes plurality of circuit boards 202A that are packaged together and cooled in accordance with an example embodiment of the invention. For the purposes of this specification, circuit boards 202A can have integrated circuit elements populated on both sides of the board. In addition, the discussion of substrates includes circuit boards, printed wiring boards and substrates with single integrated circuit elements on them. In this example embodiment, each circuit board 202A is cooled using a thermally conductive member 210A disposed thereon that conducts heat away from integrated circuit elements 204A. In this example embodiment, multiple circuit boards 202A with multiple integrated circuit elements 204A are mounted substantially perpendicularly via card edge connectors 206A on a mounting substrate 208A in a side by side relationship. On each board 202A is placed thermally conductive member 210A that is in thermal contact with integrated circuit elements 204A so as to cool the integrated circuit elements by conducting heat away from the elements. U-shaped conductive members 210A are aligned side by side and are enveloped or strapped together via a frame member 216A. Frame member 216A, in one example embodiment, is made from a thermally conductive material to conduct heat from conductive members 210A, thereby cooling integrated circuit elements 204A. Depending on the application, frame member 216A (along with substrate 208A) also functions as the main housing for the circuit module.

In this example embodiment, thermally conductive member 210A is a metallic plate formed in a U-shape that has a set of leg portions 212A that are connected at a top portion 214A. Conductive member 210A has an open end at the bottom portion of the U-shape that rests over circuit board 202A. An inner or first surface of U-shaped member 210A is either in direct contact with elements 204A, has a small air gap therebetween or is in thermal contact with the integrated circuit elements via a thermal compound that is interposed between U-shaped member 210A and integrated circuit elements 204A. Conductive member 210A may also be formed of other non-metallic materials that are thermally conductive, such as ceramics, or the conductive member can be coated with a thermally conductive coating. Metallic conductive members can also be chemically treated or anodized to draw radiation from the integrated circuit elements.

Figure 2B:
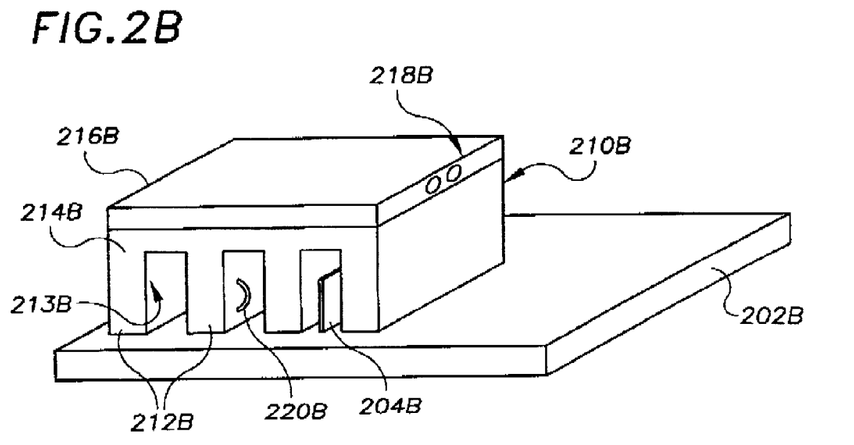
FIG. 2B illustrates a thermally conductive member for cooling integrated circuit elements disposed on a substrate in accordance with an example embodiment of the invention.

Referring now to FIG. 2B, a thermally conductive member 210B is used for cooling integrated circuit elements disposed on a substrate in accordance with an example embodiment of the invention. Thermally conductive member 210B resembles a comb-like structure with multiple leg portions 212B that are connected at a top portion 214B. Top portion 214B also serves as a heat sink to absorb heat from leg portions 212B. Member 210B is disposed over at least one integrated circuit element 204B that is mounted on a substrate 202B. In a related embodiment, member 210B cools a plurality of integrated circuit elements disposed on a plurality of substrates that are substantially perpendicularly mounted on main substrate 202B (similar to FIG. 2A). An inner surface 213B of at least one of the leg portions 212B is configured to be in thermal contact (or have a small air gap therebetween) with integrated circuit element 204 so as to absorb heat from the integrated circuit element. Inner surface 213B of one of the leg portions is anodized in order to increase heat conduction by absorbing the heat in the form of radiation. Top portion 214B of conductive member 210B acts as a heat sink to conduct heat from leg portions 212B. A cold plate 216B is disposed on top portion 214B to transfer heat away from the top portion of the conductive member. To improve heat transfer away from top portion 214B, a set of coolant channels 218B is included in cold plate 216B to facilitate coolant flow through the cold plate.

In one embodiment, a spring member 220B is interposed between a integrated circuit element (such as element 204B) and inner surface 213B to force the integrated circuit element against inner surface 213B and ensure maximum cooling of integrated circuit element 204B. A spring member (not shown) could also be included under conductive member 210B (under leg portions 212B) to support the weight of conductive member so as not to rest on integrated circuit element 204B and to compensate for the disparity in circuit boards sizes.

Figure 2C:
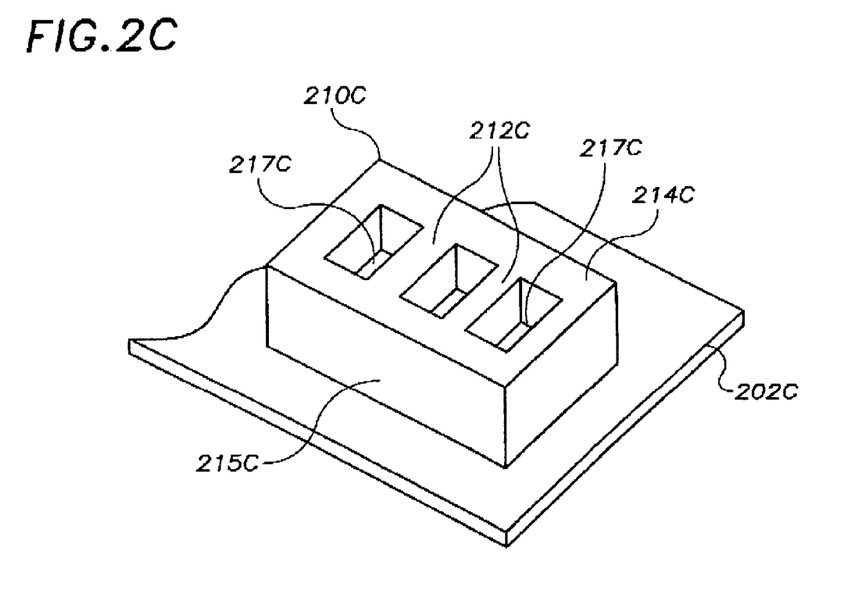
FIG. 2C illustrates a thermally conductive member for cooling integrated circuit elements disposed on a substrate in accordance with another example embodiment of the invention.

Referring now to FIG. 2C, a thermally conductive member 210C for cooling integrated circuit elements is disposed on a substrate in accordance with another example embodiment of the invention. Thermally conductive member 210C resembles a coffin-like structure with multiple leg portions 212C and sidewall portions 215C that are connected at a top portion (or surface) 214C. Conductive member 210C forms a multiple chamber enclosure with a set of openings 217C at top portion 214C that provides accessibility to the integrated circuit elements (not shown) mounted on substrate 202C. Member 210C can be formed from thermally conductive materials, such as a metal, a coated metal or a ceramic substance. Member 210C can also be formed from walls of cooling fins or heat pipes having a coolant therein for cooling the integrated circuit elements disposed within openings 217C of member 210C. In one example, member 210C has a 16×8 chamber enclosure structure or a 32×8 enclosure structure configured to cooling the indicated number of integrated circuit elements. Leg portions 212C and sidewall portions 215C are also thin in thickness to accommodate the high number of integrated circuit elements to be cooled in a high-density package. A heat sink, cold plate and/or cooling fins, or any combination thereof, can be placed at the top of member 210C to transfer heat away from member 210C.

Figure 3:
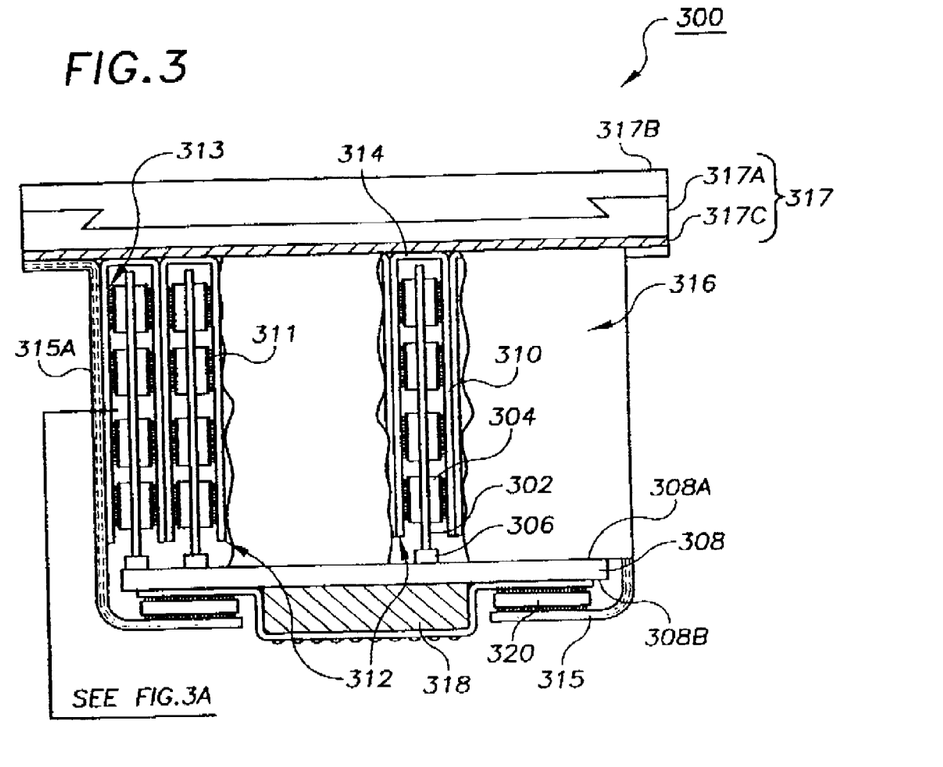
FIGS. 3 and 3A illustrate a cooling arrangement for an electronic system in accordance with an example embodiment of the invention.
Figure 3A:
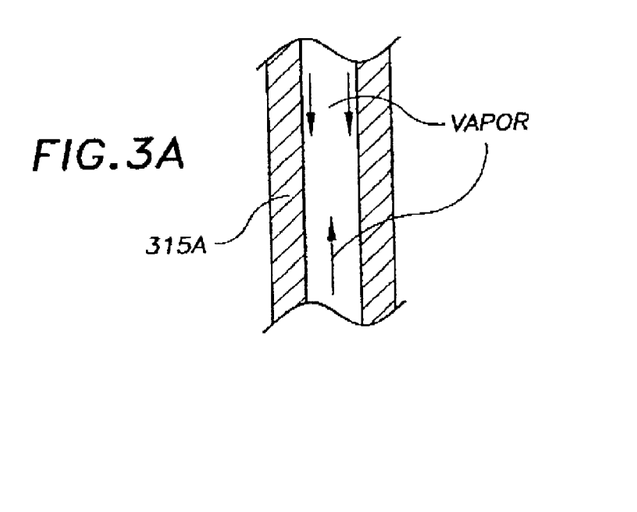

A spring member (similar to 220B) can also be placed inside the chamber enclosure of member 210C to press the integrated circuit element (or chip scale package) or a memory board against the inside surface of member 210C to maximize cooling. In a related embodiment, thermally conductive members 210B and 210C can be placed in contact with and be supported by a thermally conductive housing member (not shown) for improved heat conduction away from the integrated circuit elements. In this example embodiment, conductive members 210B and 210C provide conductive cooling of DIMMs (Dual In-line Memory Modules) through air gaps (e.g., 0–10 mil) or via a thermal compound (e.g., a thermal grease) for the transfer of heat from the memory module or boards to the top portion of the cooling member. A separate cold plate, with a coolant channel therein, disposed on each of members 210B and 210C facilitates the use of a circulating coolant to absorb heat from the electronic components. In a related embodiment, the heat sink is combined with an air-cooled cold plate to cool the electronic components and the leg portions of members 210B and 210C act as EMI (electromagnetic insulator) containers to protect the integrated circuit elements inside. Referring now to FIGS. 3 and 3A, a cooling arrangement 300 promotes the cooler operation of a multiple component electronic system in accordance with an example embodiment of the invention. Cooling arrangement 300 is configured to cool a plurality of integrated circuit elements 304 that are disposed on a plurality of substrates 302. Substrates or circuit boards 302 are substantially perpendicularly mounted on a mounting substrate 308 via a set of card edge connectors 306. Cooling arrangement 300 includes a plurality of U-shaped thermally conductive members 310 that are contained within a housing member 315 and are enclosed by a cooling plate arrangement 317. In one example, cooling plate arrangement 317 is in thermal contact with a housing 315 and U-shaped members 310. U-shaped members 310 are formed from metallic plates (or from planar heat pipes that contain a coolant) and have a set of leg portions 312 that are connected with a top portion 314. U-shaped members 310 have an open end disposed over each of circuit boards 302. An inner surface 313 of one of the leg portions is in thermal contact with integrated circuit elements 304 via a thermal compound 311 ( or via an air gap) interposed between inner surface 313 and one or more of integrated circuit elements 304.

In a related embodiment, inner surfaces 313 of leg portions 312 and integrated circuit elements 304 are in direct contact with each other. Leg portions 312 operate to cool integrated circuit elements 304 by transferring heat from integrated circuit elements 304 to top portions 314. Referring to FIG. 3A, housing member 315, primarily through housing sidewalls 315A, also absorbs heat from leg portions 312. Sidewalls 315A, similar to U-shaped members 310, can be formed from metallic plates or from planar heat pipes that contain a coolant. Where heat pipes are used for the U-shaped members or the housing member the coolant vaporizes from absorbing heat in the leg portions and moves up the heat pipe (up arrow). As the vapor condenses in transferring heat to the top portion of the housing member (or U-shaped member) the coolant returns to the bottom of the heat pipe (down arrows). U-shaped members 310 are held together via a strap or frame member 316.

Cooling plate arrangement 317 absorbs the heat transferred to top portions 314 and to the upper half of housing member 315. Cooling plate arrangement is formed from a heat sink 317A and a cold plate 317B with cold plate 317B being disposed on heat sink 317A. In a related embodiment, an additional interface member 317C (in the form of a thin metal membrane) is interposed between heat sink 317A and the top of housing member 315. Where increased heat dissipation for integrated circuit elements 304 is required, cold plate 317 can be replaced with a cold plate that includes a coolant channel. To increase heat transfer to top portions 314 and to housing member 315, the leg portions of U-shaped members 310 are in contact with one another. In this example, the U-shaped members and the housing member are formed from aluminum or copper plates or from aluminum or copper heat pipes that have a coolant disposed therein. The coolant can include, but is not limited to, water at reduced pressure, acetone or fluorinert (3MFC72).

Figure 3B:
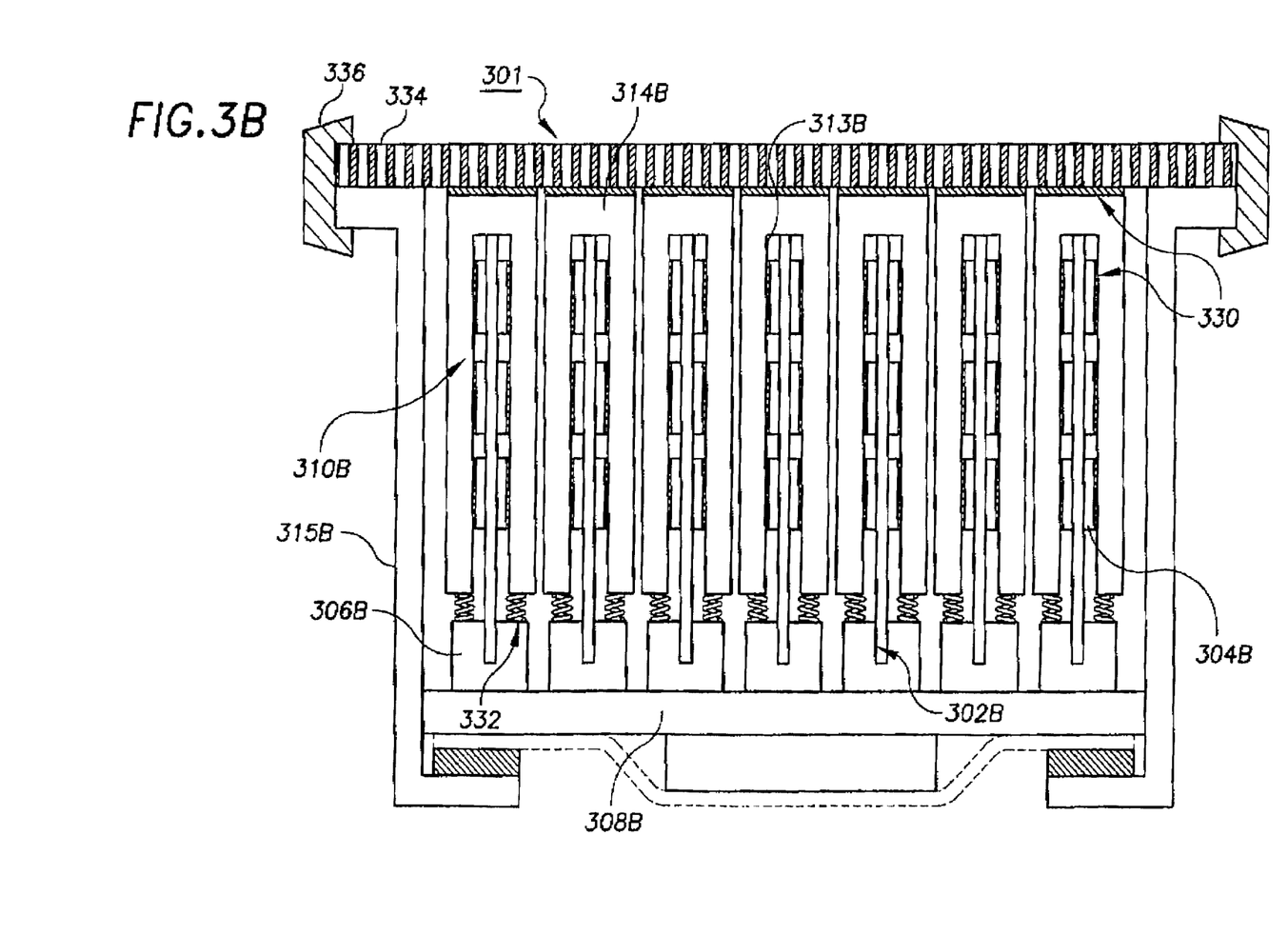
FIG. 3B illustrates a cooling arrangement for an electronic system in accordance with another example embodiment of the invention.

Referring now to FIG. 3B, an alternative cooling arrangement 301 promotes the cooler operation of a multiple component electronic system in accordance with another example embodiment of the invention. In this embodiment, U-shaped members 310B are supported on connectors 306B and over main substrate 308B by a plurality of spring members 332 that are disposed at the open end of the U-shaped members. The cold plate arrangement includes a cold plate 334 that is disposed on housing 315B and on U-shaped members 310B. Cold plate 334 is secured to housing 315B via a retention clamp 336. A thermal compound 330 is interposed between cold plate 334 and top portions 314B of members 310B. Spring members 332 serve to compress the thermal compound to minimize the thickness of the compound layer between cold plate 334 and top portions 314B. In addition, spring members 332 serve to provide a z-dimension alignment of U-shaped members 310B (U-shape member can float above substrate 308B) with cold plate 334 and with any of circuit boards 302B that are not uniform in height above main substrate 308B. Thermal compound 330 is also interposed between integrated circuit elements 304B on circuit boards 302B and an inner surface 313B of members 310B. In another embodiment, a small air gap exists between inner surface 313B and circuit elements 304B.

With cooling arrangement 300, circuit modules can now be formed that comprise a subcomponent of a main system board. In particular, where integrated circuit elements 304 include memory devices, a memory circuit module can be formed that is easily removable from a system board of a PC or server. Where integrated circuit elements 304 include microprocessors, a microprocessor module can be formed that is also easily removable from the system board.

Figure 4:
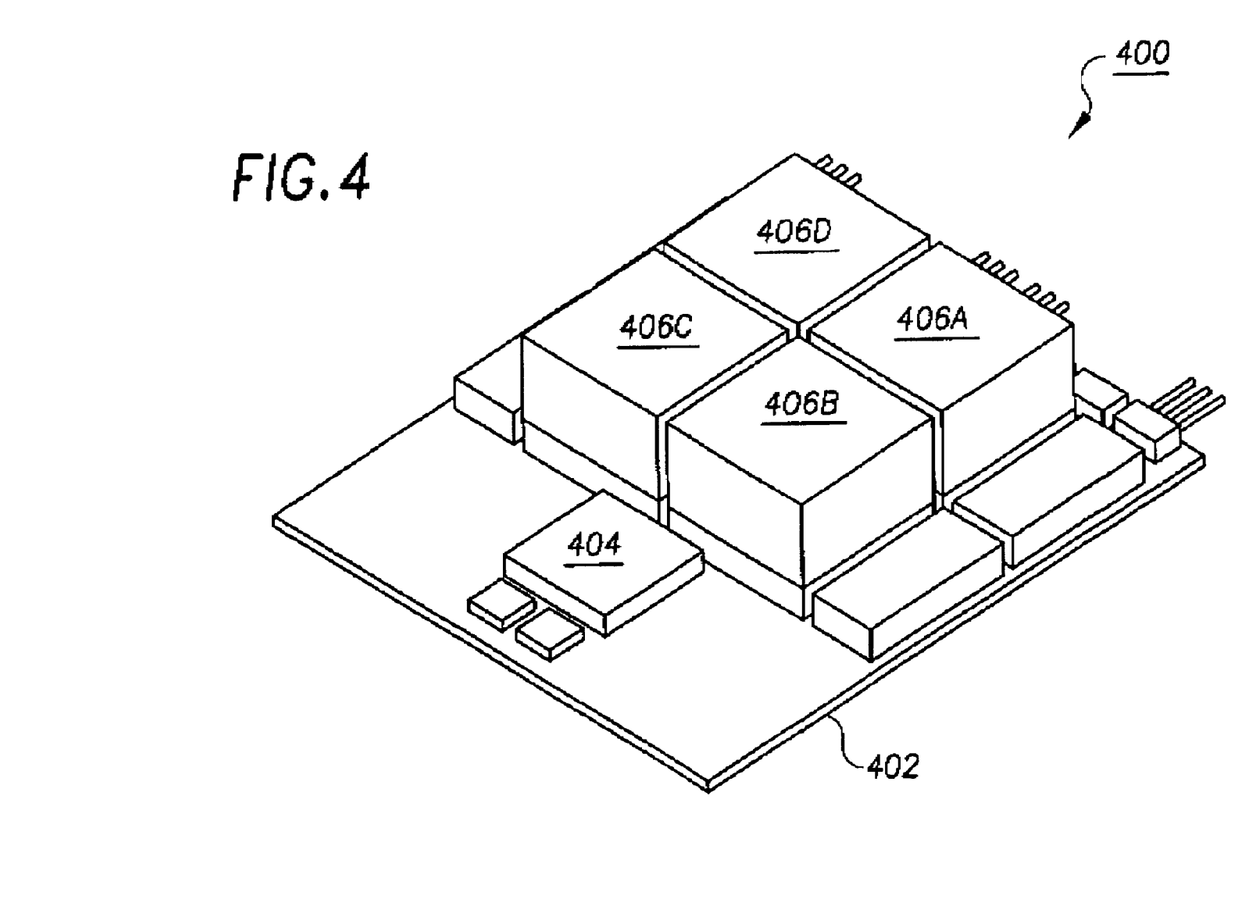
FIG. 4 illustrates a system board that includes circuit modules in accordance with an example embodiment of the invention.

Referring now to FIG. 4 illustrates a system board 400 with circuit modules made in accordance with an example embodiment of the invention. In particular, system board 400 includes a main substrate 402 that has thereon multiple memory circuit modules 406A–406D adjacent a microprocessor module 404. To form circuit modules 404 and 406A–406D, an electronic system is combined with one of the cooling arrangements (e.g., cooling arrangement 300) resulting in a circuit module similar to that illustrated in FIG. 3. In this example embodiment, circuit modules 406A–406D include integrated circuit elements 304, as in FIG. 3, that are memory devices that are supported in a plurality of circuit boards 302 on a first side of main substrate 308A. A second side of main substrate 308B includes a connector member 318 that protrudes through an opening of a bottom portion of housing member 315 and couples the memory boards to main system board 402. Connector member 318 is a large grid array connector that protrudes through a bottom portion of housing 315. A controller element 320 for controlling signals to the memory boards is mounted on second side 308B and is cooled by being in thermal contact with the bottom portion of housing member 315.

Field serviceability of an electronic system is simplified when using circuit modules 404 or 406A–406D since the entire module is removed and replaced with a new one. In removing the circuit module, cold plate 317B is first removed from heat sink 317A and then the circuit module is removed from system board 402 and replaced with a new circuit module. Once the replacement circuit module is attached to system board 402, cold plate 317B is reattached to the heat sink on the circuit module. With the present approach, there is no need to troubleshoot for any problems within the circuit module or down to its integrated circuit element on the circuit board. Once any problem is isolated to a particular circuit module it can be quickly removed and replaced to keep the system operational.

The present invention is believed to be applicable to a variety of high performance electronic systems requiring lower cost and more compact cooling solutions. The present invention has been found to be particularly applicable and beneficial in high performance electronic systems that require high-density memory packaging of integrated circuit elements, reduced communication path lengths between electronic components and ease of field serviceability. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. An apparatus for cooling a plurality of integrated circuit elements disposed on a plurality of substrates, the plurality of substrates being substantially perpendicularly mounted on a main substrate, the apparatus comprising:
    a thermally conductive member having a set of leg portions connected with a top portion and an open end configured to be disposed over the substrates, a first surface of at least one of the leg portions configured to be in thermal contact with at least one of the integrated circuit elements, the top portion of the conductive member configured to conduct heat from the leg portions of the conductive member; and
    means for conducting heat from the top portion to a nongaseous thermal medium, the means for conducting being disposed over the top portion.

2. The apparatus of claim 1, wherein the top portion is comprised of a heat sink.

3. An apparatus for cooling a plurality of integrated circuit elements disposed on a plurality of substrates, the plurality of substrates being substantially perpendicularly mounted on a main substrate, the apparatus comprising:
    a thermally conductive member having a set of leg portions connected with a top portion and an open end configured to be disposed over a respective one of the substrates, a first surface of at least one of the leg portions configured to be in thermal contact with at least one of the integrated circuit elements, the top portion of the conductive member configured to conduct heat from the leg portions of the conductive member; and
    a first cold plate disposed on the heat sink,
    wherein the top portion is comprised of a heat sink.

4. The apparatus of claim 1, wherein the leg portions are connected via at least two sidewall portions to form an enclosure, the open end of the conductive member disposed over a integrated circuit element.

5. An apparatus for cooling a plurality of integrated circuit elements disposed on a plurality of substrates, the plurality of substrates being substantially perpendicularly mounted on a main substrate, the apparatus comprising:
    a thermally conductive member having a set of leg portions connected with a top portion and an open end configured to be disposed over a respective one of the substrates, a first surface of at least one of the leg portions configured to be in thermal contact with at least one of the integrated circuit elements, the top portion of the conductive member configured to conduct heat from the leg portions of the conductive member,
    wherein the leg portions are connected via at least two sidewall portions to form an enclosure, the open end of the conductive member disposed over a integrated circuit element, and a portion of the top portion has an opening that provides accessibility to the at least one integrated circuit element.

6. The apparatus of claim 1, wherein the thermally conductive member is supported on the main substrate.

7. The apparatus of claim 1, wherein the thermally conductive member is in contact with and supported by a housing member.

8. The apparatus of claim 1, further comprising a heat sink arrangement disposed over the thermally conductive member.

9. An apparatus for cooling a plurality of integrated circuit elements disposed on a plurality of substrates, the plurality of substrates being substantially perpendicularly mounted on a main substrate, the apparatus comprising:
    a thermally conductive member having a set of leg portions connected with a top portion and an open end configured to be disposed over a respective one of the substrates, a first surface of at least one of the leg portions configured to be in thermal contact with at least one of the integrated circuit elements, the top portion of the conductive member configured to conduct heat from the leg portions of the conductive member; and a heat sink arrangement disposed over the thermally conductive member, wherein the heat sink arrangement has a coolant channel.

10. An apparatus for cooling a plurality of integrated circuit elements disposed on a plurality of substrates, the plurality of substrates being substantially perpendicularly mounted on a main substrate, the apparatus comprising:

a thermally conductive member having a set of leg portions connected with a top portion and an open end configured to be disposed over a respective one of the substrates, a first surface of at least one of the leg portions configured to be in thermal contact with at least one of the integrated circuit elements, the top portion of the conductive member configured to conduct heat from the leg portions of the conductive member; and a spring member in contact with at least one leg portion that forces the at least one integrated circuit element against the first surface.

11. The apparatus of claim 1, wherein the first surface of the leg portion is anodized.

12. The apparatus of claim 1, wherein the thermally conductive member is made of metal.

13. The apparatus of claim 1, wherein the thermally conductive member includes a U-shaped member.

14. The apparatus of claim 10, wherein the U-shaped member has a channel through the top and leg portions of the U-shaped member with a coolant that vaporizes from absorbing heat in the leg portions and condenses in transferring heat to the top portion.

15. The arrangement of claim 14, wherein the U-shaped members are formed from aluminum and the coolant disposed therein contains a rust-inhibiting agent.

16. The arrangement of claim 14, wherein the U-shaped members are formed from copper and the coolant disposed therein is water-based.

17. A cooling arrangement for a plurality of integrated circuit elements disposed on a plurality of substrates, the plurality of substrates being substantially perpendicularly mounted on a main substrate, the cooling arrangement comprising:

a plurality of U-shaped thermally conductive members, each having a set of leg portions connected with a top portion and an open end disposed over a respective one of the substrates, a first surface of at least one of the leg portions being in thermal contact with at least one of the integrated circuit elements;

a housing member containing therein the U-shaped members; and a cooling plate arrangement in thermal contact with the housing and the top portions of the U-shaped members.

18. The arrangement of claim 17, wherein the cooling plate arrangement further comprising a first cold plate disposed on a first heat sink that is disposed on the housing.

19. The arrangement of claim 17, wherein the top and leg portions of the U-shaped member are filled with a coolant that vaporizes from absorbing heat in the leg portions and condenses in transferring heat to the cooling plate arrangement.

20. The arrangement of claim 17, wherein the at least one sidewall of the housing is filled with a coolant that vaporizes from absorbing heat in the at least one sidewall and condenses in transferring heat to the cooling plate arrangement.

21. The arrangement of claim 20, wherein the at least one sidewall of the housing is in contact with at least one of the U-shaped members and wherein at least one of the leg portions of one U-shaped member is in contact with the leg portion of an adjacent one of the U-shaped members.

22. The arrangement of claim 17, wherein the cooling plate arrangement includes a coolant channel.

23. An electronic system in combination with a cooling arrangement comprising:

a plurality of substrates substantially perpendicularly mounted in a side by side relationship on a main substrate, wherein each of the substrates includes a plurality of integrated circuit elements;

a plurality of U-shaped thermally conductive members, each having a set of leg portions connected with a top portion and an open end disposed over a respective one of the substrates, a first surface of at least one of the leg portions being in thermal contact with at least one of the integrated circuit elements;

a housing member containing therein the U-shaped members; and a cooling plate arrangement in thermal contact with the housing and the top portions of the U-shaped members.

24. The system of claim 23, wherein the integrated circuit elements include a set of memory elements.

25. The system of claim 24, wherein a first side of the main substrate supports the plurality of substrates and a second side of the main substrate further comprises a controller element disposed thereon and in contact with a bottom portion of the housing.

26. The system of claim 25, further comprising a connector member disposed on the second side of the main substrate and that protrudes through an opening of the bottom portion of the housing, wherein the connector member couples the plurality of substrates to an external circuit board.

27. The system of claim 23, further comprising a plurality of spring members for supporting the U-shaped members over the respective substrates, wherein each of the spring members is disposed at the open end of the U-shaped member and over the main substrate.

28. The system of claim 23, wherein at least one of the leg portions is in contact with the leg portion an adjacent one of the U-shaped members.

29. The system of claim 23, wherein the U-shaped members and the housing are formed from aluminum and have a coolant disposed therein.

30. The system of claim 23, wherein the U-shaped members and the housing are formed from copper and have a coolant disposed therein.

31. The system of claim 23, wherein the cooling plate arrangement includes a first cold plate disposed on a first heat sink that is disposed over the housing.

32. The system of claim 31, wherein the first cold plate includes at least one cooling channel.

* * * * *